(12) United States Patent
Miao et al.

(10) Patent No.: US 11,631,759 B2
(45) Date of Patent: Apr. 18, 2023

(54) ELECTROSTATIC DISCHARGE PROTECTION DEVICES AND METHODS FOR FABRICATING ELECTROSTATIC DISCHARGE PROTECTION DEVICES

(71) Applicant: GLOBALFOUNDRIES U.S. Inc., Santa Clara, CA (US)

(72) Inventors: Meng Miao, Santa Clara, CA (US); Alain François Loiseau, Santa Clara, CA (US); Souvick Mitra, Santa Clara, CA (US); Robert John Gauthier, Jr., Santa Clara, CA (US); You Li, Santa Clara, CA (US); Wei Liang, Santa Clara, CA (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 107 days.

(21) Appl. No.: 17/164,855

(22) Filed: Feb. 2, 2021

(65) Prior Publication Data
US 2022/0246749 A1 Aug. 4, 2022

(51) Int. Cl.
*H01L 29/06* (2006.01)
*H01L 29/74* (2006.01)
*H01L 29/66* (2006.01)

(52) U.S. Cl.
CPC ...... *H01L 29/7432* (2013.01); *H01L 29/0649* (2013.01); *H01L 29/66393* (2013.01); *H01L 29/7436* (2013.01)

(58) Field of Classification Search
CPC ............... H01L 29/808; H01L 29/0692; H01L 29/1095; H01L 29/0634; H01L 29/7835; H01L 29/66901; H01L 29/7816; H01L 29/1066; H01L 29/78; H01L 29/66681; H01L 29/0615; H01L 29/0661; H01L 29/0623; H01L 29/0865; H01L 29/0886; H01L 29/41725; H01L 29/4238; H01L 29/0834; H01L 29/73; H01L 29/8086;
(Continued)

(56) References Cited

U.S. PATENT DOCUMENTS

| 4,939,616 A | 7/1990 | Rountree |
| 6,268,992 B1 | 7/2001 | Lee et al. |

(Continued)

*Primary Examiner* — Natalia A Gondarenko
(74) *Attorney, Agent, or Firm* — Viering Jentschura & Partner mbB (57) ABSTRACT

An ESD protection device may be provided, including: a substrate including a first conductivity region and a second conductivity region arranged therein. The first conductivity region may include a first terminal region and a second terminal region electrically coupled with each other. The second conductivity region may include a third terminal region and a fourth terminal region electrically coupled with each other. The second conductivity region may further include a fifth terminal region electrically coupled with the first and second terminal regions. The fifth terminal region may be arranged laterally between the third terminal region and the fourth terminal region. The first conductivity region, the first terminal region, the third terminal region, and the fifth terminal region may have a first conductivity type. The second conductivity region, the second terminal region, and the fourth terminal region may have a second conductivity type different from the first conductivity type.

20 Claims, 7 Drawing Sheets

(58) Field of Classification Search
CPC ............. H01L 29/7811; H01L 29/0619; H01L 29/0649; H01L 29/0653; H01L 29/0696; H01L 29/7832; H01L 29/0847; H01L 29/66659; H01L 29/7838; H01L 29/0843; H01L 29/0882; H01L 29/1083; H01L 29/41758; H01L 29/42316; H01L 29/6606; H01L 29/66893; H01L 29/66568; H01L 29/66674; H01L 29/70; H01L 29/7424; H01L 29/7801; H01L 29/7432; H01L 29/66393; H01L 29/7436; H01L 27/0259; H01L 27/0262; H01L 27/0266; H01L 27/0623; H01L 27/098; H01L 27/0617; H01L 2924/13091; H01L 2924/1305; H01L 2924/13055; H01L 2924/13062
USPC ........ 257/133, 285, 341, 355, 343, 344, 379
See application file for complete search history.

(56) References Cited

U.S. PATENT DOCUMENTS

| | | | |
|---|---|---|---|
| 9,214,540 | B2 | 12/2015 | Tsai et al. |
| 9,716,087 | B1* | 7/2017 | Huang ................. H01L 27/0262 |
| 2010/0103570 | A1* | 4/2010 | Song ................... H01L 27/0262 |
| | | | 257/E29.211 |
| 2017/0110446 | A1* | 4/2017 | Huang ................ H01L 29/1045 |
| 2017/0287894 | A1* | 10/2017 | Kuo .................... H01L 29/7821 |
| 2018/0006016 | A1* | 1/2018 | Sorgeloos ............ H01L 29/7436 |
| 2018/0366460 | A1* | 12/2018 | Boselli ................ H01L 27/0229 |

* cited by examiner

ELECTROSTATIC DISCHARGE PROTECTION DEVICES AND METHODS FOR FABRICATING ELECTROSTATIC DISCHARGE PROTECTION DEVICES

TECHNICAL FIELD

The present disclosure relates generally to electrostatic discharge (ESD) protection devices and methods for fabricating the ESD protection devices.

BACKGROUND

ESD protection devices are often used to protect electrical apparatuses from being damaged by ESD events. One type of ESD protection device is the silicon-controlled rectifier (SCR) device that is capable of conducting current away from an apparatus during an ESD event. However, the trigger voltage of a typical SCR device tends to be high. Therefore, there is a risk that during an ESD event, excess current is not conducted away from the apparatus, resulting in ESD failure in the apparatus. Although the trigger voltage of the SCR device may be reduced by adding highly doped diffusion nodes across the P-N junction between the P-well and the N-well in the SCR device, this tends to increase the holding voltage and the on-resistance of the SCR device.

SUMMARY

According to various non-limiting embodiments, there may be provided an electrostatic discharge (ESD) protection device including: a substrate including a first conductivity region and a second conductivity region arranged therein; where the first conductivity region may include a first terminal region and a second terminal region electrically coupled with each other; where the second conductivity region may include a third terminal region and a fourth terminal region electrically coupled with each other, where the second conductivity region may further include a fifth terminal region arranged laterally between the third terminal region and the fourth terminal region, and electrically coupled with the first terminal region and the second terminal region; and where the first conductivity region, the first terminal region, the third terminal region, and the fifth terminal region may have a first conductivity type; and where the second conductivity region, the second terminal region, and the fourth terminal region may have a second conductivity type different from the first conductivity type.

According to various non-limiting embodiments, there may be provided a method for fabricating an ESD protection device, including: providing a substrate; forming a first conductivity region and a second conductivity region within the substrate; forming a first terminal region and a second terminal region within the first conductivity region; forming a third terminal region, a fourth terminal region, and a fifth terminal region within the second conductivity region; wherein the fifth terminal region may be arranged laterally between the third terminal region and the fourth terminal region; electrically coupling the first terminal region, the second terminal region, and the fifth terminal region; and electrically coupling the third terminal region and the fourth terminal region. The first conductivity region, the first terminal region, the third terminal region, and the fifth terminal region may have a first conductivity type; and the second conductivity region, the second terminal region, and the fourth terminal region may have a second conductivity type different from the first conductivity type.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which.

DETAILED DESCRIPTION

The embodiments generally relate to semiconductor devices. More particularly, some embodiments relate to ESD protection devices. The ESD protection devices may, for example, be incorporated into integrated circuits (ICs). The devices or ICs may be used with apparatuses such as, but not limited to, consumer electronic products.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about,", "substantially" is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1:
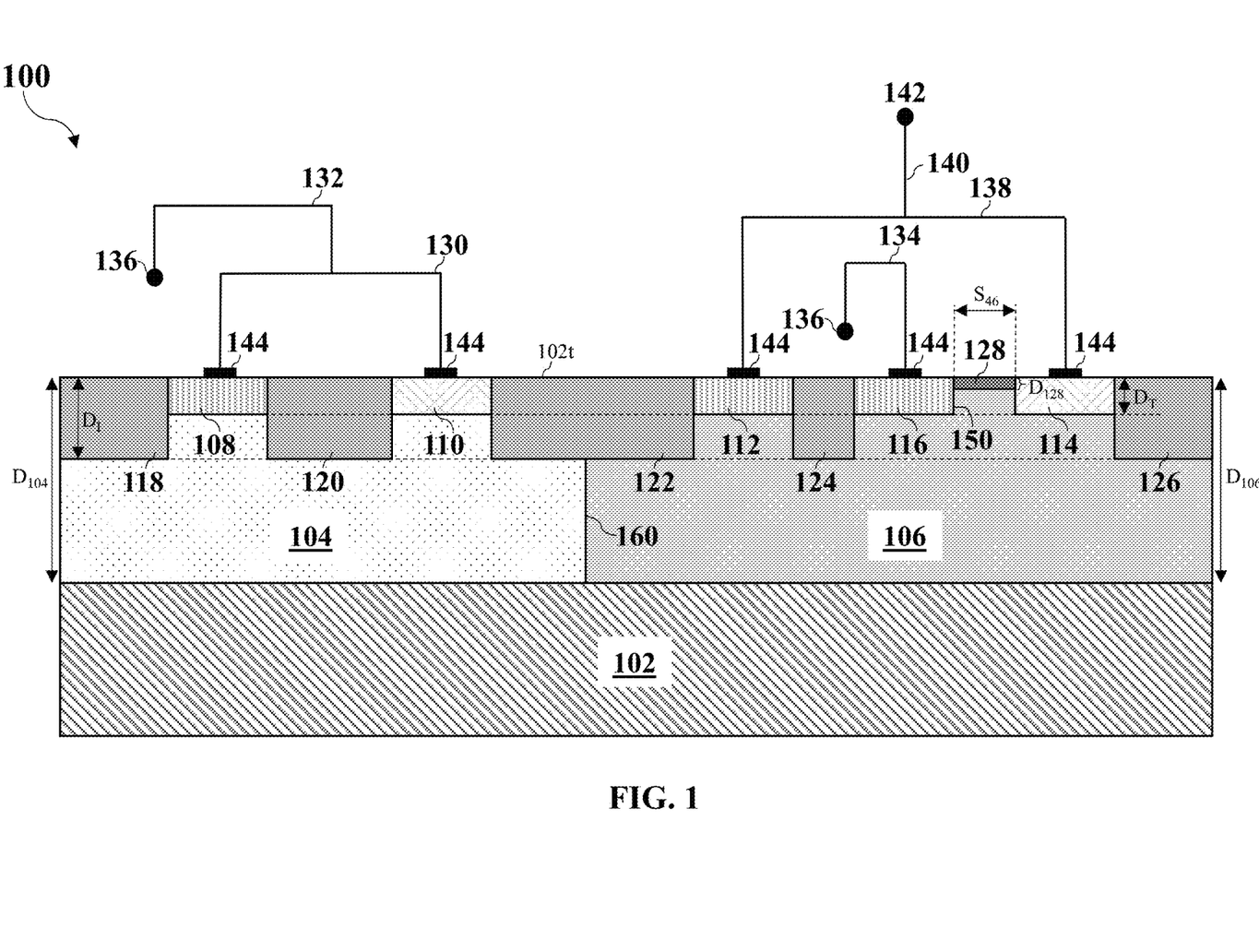
FIG. 1 shows a simplified cross-sectional view of an ESD protection device according to various non-limiting embodiments.

FIG. 1 shows a simplified cross-sectional view of an ESD protection device 100 according to various non-limiting embodiments. The ESD protection device 100 may be a silicon-controlled rectifier (SCR) device.

As shown in FIG. 1, the ESD protection device 100 may include a substrate 102. The substrate 102 may include a semiconductor material, such as but not limited to, silicon (Si), germanium (Ge), silicon carbide (SiC), gallium arsenide (GaAs), gallium nitride (GaN), or combinations thereof. For example, the substrate 102 may include single crystal silicon. In some non-limiting embodiments, the substrate 102 may include a semiconductor-on-insulator substrate, such as but not limited to a silicon-on-insulator (SOI) substrate, a germanium-on-insulator (GeOI) substrate, a SiC-on-insulator (SiCOI) substrate, a GaAs-on-insulator (GaAsOI) substrate, a GaN-on-insulator (GaNOI) substrate, or combinations thereof.

The substrate 102 may include a first conductivity region 104 and a second conductivity region 106 arranged therein. As shown in FIG. 1, the first conductivity region 104 and the second conductivity region 106 may be arranged laterally adjacent to each other and may join each other. A depth $D_{104}$ of the first conductivity region 104 and a depth $D_{106}$ of the second conductivity region 106 may be approximately equal, and may each range from about 0.2 µm to about 1 µm.

The first conductivity region 104 may include a first terminal region 108 and a second terminal region 110; whereas, the second conductivity region 106 may include a third terminal region 112 and a fourth terminal region 114. The second conductivity region 106 may also include a fifth terminal region 116 arranged laterally between the third terminal region 112 and the fourth terminal region 114. As shown in FIG. 1, the terminal regions 108, 110, 112, 114, 116 may be arranged along a top surface 102t of the substrate 102. For example, the top surfaces of these terminal regions 108, 110, 112, 114, 116 may be coplanar and aligned with the top surface 102t of the substrate 102. Depths $D_T$ of the terminal regions 108, 110, 112, 114, 116 may be substantially equal and may each range from about 0.05 µm to about 0.2 µm.

In various non-limiting embodiments, the substrate 102, the first and second conductivity regions 104, 106, and the first to fifth terminal regions 108-116 may include dopants. The substrate 102 may have a same conductivity type (in other words, may include dopants of the same conductivity type) as the first conductivity region 104. For example, the substrate 102, the first conductivity region 104, the first terminal region 108, the third terminal region 112 and the fifth terminal region 116 may have a first conductivity type (in other words, may include dopants of the first conductivity type). On the other hand, the second conductivity region 106, the second terminal region 110 and the fourth terminal region 114 may have a second conductivity type different from the first conductivity type (in other words, may include dopants of the second conductivity type). In various non-limiting embodiments, the first conductivity type may be P-type and the second conductivity type may be N-type. However, the first conductivity type may alternatively be N-type and the second conductivity type may alternatively be P-type. The P-type dopants may include boron (B), indium (In), or combinations thereof; whereas, the N-type dopants may include phosphorous (P), arsenic (As), antimony (Sb), or combinations thereof. Accordingly, a junction 150 between the fifth terminal region 116 and the second conductivity region 106, and a junction 160 between the first conductivity region 104 and the second conductivity region 106 may be P-N junctions.

Doping concentrations (number of dopants per unit volume) of the first and second conductivity regions 104, 106 may be approximately equal and may each be higher than a doping concentration of the substrate 102. Further, doping concentrations of the terminal regions 108, 110, 112, 114, 116 may be approximately equal. The doping concentrations of the first and second terminal regions 108, 110 may each be higher than the doping concentration of the first conductivity region 104, and the doping concentrations of the third, fourth and fifth terminal regions 112, 114, 116 may each be higher than the doping concentration of the second conductivity region 106. For example, the doping concentration of the substrate 102 may range from about 1e15 $cm^{-3}$ to about 5e15 $cm^{-3}$; the doping concentration of each of the first conductivity region 104 and the second conductivity region 106 may range from about 5e17 $cm^{-3}$ to about 5e18 $cm^{-3}$; the doping concentration of each of the first to fifth terminal regions 108, 110, 112, 114, 116 may range from about 5e19 $cm^{-3}$ to about 1e21 $cm^{-3}$.

In various non-limiting embodiments, each of the first and second conductivity regions 104, 106 may be a well. The first terminal region 108 and the fourth terminal region 114 may be well nodes; and the second terminal region 110, the third terminal region 112 and the fifth terminal region 116 may be diffusion nodes. For example, the substrate 102 may be a P-substrate, the first conductivity region 104 may be a P-well, the second conductivity region 106 may be an N-well, the first terminal region 108 may be a P-well (PW) node, the second terminal region 110 may be an N diffusion (ND) node, the third terminal region 112 and the fifth terminal region 116 may be P diffusion (PD) nodes, and the fourth terminal region 114 may be an N-well (NW) node.

Referring to FIG. 1, the ESD protection device 100 may further include first, second, third, fourth and fifth insulation elements 118, 120, 122, 124, 126. The first insulation element 118 may be arranged between the first terminal region 108 and a side surface of the substrate 102, and the fifth insulation element 126 may be arranged between the fourth terminal region 114 and an opposite side surface of the substrate 102. The second insulation element 120 may be arranged laterally between the first terminal region 108 and the second terminal region 110, the third insulation element 122 may be arranged laterally between the second terminal region 110 and the third terminal region 112, and the fourth insulation element 124 may be arranged laterally between the third terminal region 112 and the fifth terminal region 116. As shown in FIG. 1, the insulation elements 118, 120, 122, 124, 126 may be arranged along the top surface 102t of the substrate 102. For example, the top surfaces of these insulation elements 118, 120, 122, 124, 126 may be coplanar and aligned with the top surface 102t of the substrate 102. Depths $D_I$ of the insulation elements 118, 120, 122, 124, 126 may be approximately equal and may be greater than the depths $D_T$ of the terminal regions 108, 110, 112, 114, 116. For example, the depth $D_I$ of each insulation element 118, 120, 122, 124, 126 may range from about 0.1 μm to about 0.2 μm. Accordingly, each of the first and fifth insulation elements 118, 126 may isolate the terminal regions 108, 110, 112, 114, 116 from external interference; whereas, the second, third and fourth insulation elements 120, 122, 124 may isolate each pair of neighboring terminal regions 108, 110/110, 112/112, 116. Each insulation element 118, 120, 122, 124, 126 may include an electrically insulating material, for example, a dielectric material such as, but not limited to, silicon oxide. For example, each insulation element 118, 120, 122, 124, 126 may be a shallow trench isolation (STI) region.

The ESD protection device 100 may also include an isolation element 128 arranged laterally between the fourth terminal region 114 and the fifth terminal region 116. As shown in FIG. 1, a lateral spacing $S_{46}$ may be arranged between the fourth terminal region 114 and the fifth terminal region 116, and the isolation element 128 may extend across the entire length of the lateral spacing $S_{46}$ between the terminal regions 114, 116. Accordingly, the isolation element 128 may join the fourth terminal region 114 and may further join the fifth terminal region 116 (for example, along the side surfaces of the terminal regions 114, 116 as shown in FIG. 1). The isolation element 128, the fourth terminal region 114 and the fifth terminal region 116 may be arranged along the top surface 102t of the substrate 102. For example, the top surfaces of the isolation element 128, the fourth terminal region 114 and the fifth terminal region 116 may be coplanar and aligned with the top surface 102t of the substrate 102. A portion of the second conductivity region 106 may be arranged under the isolation element 128 and laterally between the fourth terminal region 114 and the fifth terminal region 116.

As shown in FIG. 1, a depth $D_{128}$ of the isolation element 128 may be less than the depth $D_I$ of each of the insulation elements 118, 120, 122, 124, 126. For example, the depth $D_{128}$ of the isolation element 128 may range from about 0.01 μm to about 0.5 μm. The isolation element 128 may also include an electrically insulating material for example, dielectric material, such as, but not limited to, silicon oxide. Accordingly, the isolation element 128 may electrically isolate the fifth terminal region 116 from the fourth terminal region 114 along the top surface 102t of the substrate 102. In some non-limiting embodiments, the isolation element 128 may include a different material from the insulation elements 118, 120, 122, 124, 126. For example, the isolation element 128 may include a silicide block; whereas, each insulation element 118, 120, 122, 124, 126 may be a STI region including silicon oxide. In alternative non-limiting embodiments, the isolation element 128 and each insulation element 118, 120, 122, 124, 126 may include a same electrically insulating material. For example, the isolation element 128 and the insulation elements 118, 120, 122, 124, 126 may be STI regions, with the isolation element 128 being a very shallow STI region.

The ESD protection device 100 may include an electrically conductive unit (including for example, electrically conductive lines 130, 132, 134) connecting the first terminal region 108, the second terminal region 110 and the fifth terminal region 116 to a first conductive pad 136. In other words, the first terminal region 108, the second terminal region 110 and the fifth terminal region 116 may be electrically coupled with each other. The ESD protection device 100 may also include another electrically conductive unit (including for example, electrically conductive lines 138, 140) connecting the third terminal region 112 and the fourth terminal region 114 to a second conductive pad 142. In other words, the third terminal region 112 and the fourth terminal region 114 may be electrically coupled with each other. Further conductive pads 144 may be arranged over the respective terminal regions 108, 110, 112, 114, 116 to facilitate the connection of the conductive lines 130, 134, 138 to the regions 108, 110, 112, 114, 116. Each of the conductive lines 130, 132, 134, 138, 140 and conductive pads 136, 142, 144 may include an electrically conductive material, such as, but not limited to metal.

In an exemplary non-limiting embodiment, the first conductivity type may be P-type and the second conductivity type may be N-type. In this non-limiting embodiment, when the ESD protection device 100 is in operation, the first conductive pad 136 may be connected to ground and the second conductive pad 142 may be connected to an input/output terminal of an apparatus to be protected. A voltage at this input/output terminal may be a positive voltage and hence, the P-N junctions 150, 160 in the ESD protection device 100 may be reverse-biased. When an ESD event occurs in the apparatus, the voltage at the input/output terminal of the apparatus may exceed a trigger voltage. This may cause the P-N junction 150 to break down and a first discharge current to flow from the second conductive pad 142 through the ESD protection device 100 to ground. For example, the first discharge current may flow from the second conductive pad 142 through the fourth terminal region 114, the second conductivity region 106, the fifth terminal region 116 and the first conductive pad 136 in this order, to ground. Thereafter, a second discharge current may flow from the second conductive pad 142 through the ESD protection device 100 to ground. For example, the second discharge current may flow from the second conductive pad 142 through the third terminal region 112, the second conductivity region 106, the fifth terminal region 116 and the first conductive pad 136 in this order, to ground. A duration of the second discharge current may be shorter than a duration of the first discharge current. Subsequently, the P-N junction 160 may break down and a third discharge current may flow from the second conductive pad 142 through the ESD protection device 100 to ground. For example, the third discharge current may flow from the second conductive pad 142 through the third terminal region 112, the second conductivity region 106, the first conductivity region 104, the second terminal region 110 and the first conductive pad 136 in this order, to ground. In other words, the first conductivity region 104, together with the second and fifth terminal regions 110, 116, may serve as a cathode of the ESD protection device 100; whereas, the second conductivity region 106, together with the third and fourth terminal regions 112, 114, may serve as an anode of the ESD protection device 100. Excess current may thus be redirected from the apparatus during an ESD event and the apparatus may be protected from ESD failure. It would be clear to a person skilled in the art that the directions of the first and second discharge currents described above will change accordingly when the first conductivity type and the second conductivity type are instead the N-type and the P-type respectively.

Because of the higher doping concentrations of the fourth and fifth terminal regions 114, 116, the P-N junction 150 may break down at a smaller voltage as compared to the voltage at which the P-N junction 160 breaks down. Accordingly, as compared to prior art devices, the trigger voltage of the ESD protection device 100 may be smaller. For example, the trigger voltage of prior art devices may range from around 10V to 14V; whereas, the trigger voltage of the ESD protection device 100 may range from about 6V to 10V (and may in one non-limiting embodiment, be about 8V). In addition, including the fifth terminal region 116 laterally between the third and fourth terminal regions 112, 114 (instead of to the left/right of both regions 112, 114) may allow the ESD protection device 100 to maintain similar current-voltage (IV) characteristics as prior art devices. For example, the holding voltage/clamping voltage of the ESD protection device 100 may be maintained at a level similar to that of prior art devices. Further, the base width of the ESD protection device 100 may also be similar to that of prior art devices.

Including the isolation element 128 laterally between the fourth and fifth terminal regions 114, 116 may further reduce the voltage at which the P-N junction 150 breaks down (or in other words, may further reduce the trigger voltage of the ESD protection device 100). However, this isolation element 128 may be optional.

Figure 2:
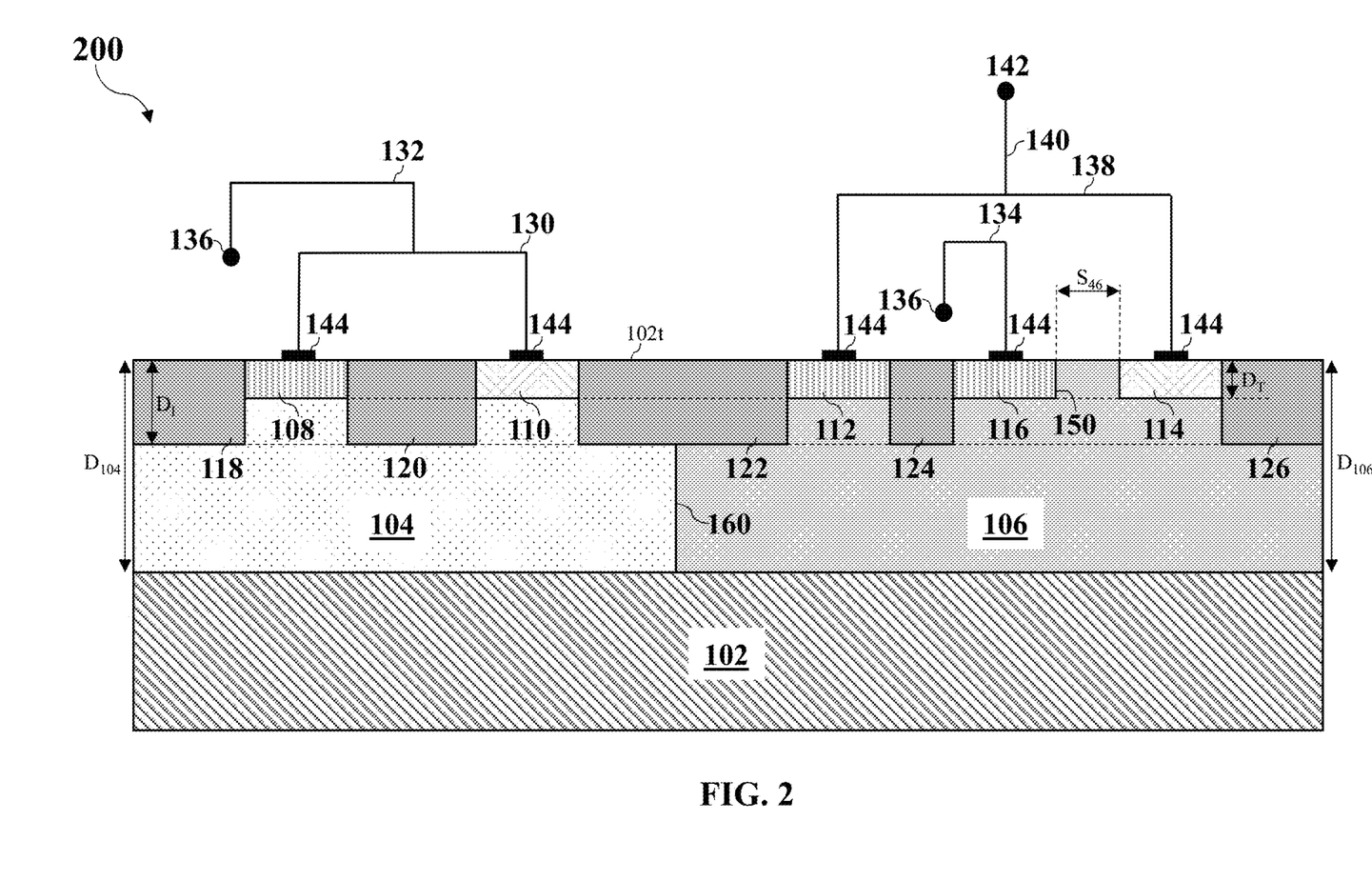
FIG. 2 shows a simplified cross-sectional view of an ESD protection device according to alternative non-limiting embodiments.

FIG. 2 shows a cross-sectional view of an ESD protection device 200 according to alternative non-limiting embodiments. The ESD protection device 200 is similar to the ESD protection device 100 and hence, the common features are labelled with the same reference numerals and need not be discussed.

As shown in FIG. 2, the isolation element 128 may be absent in the ESD protection device 200. Accordingly, a portion of the second conductivity region 106 may be arranged laterally between the fourth terminal region 114 and the fifth terminal 116, where this portion of the second conductivity region 106, the fourth terminal region 114 and the fifth terminal region 116 may be arranged along the top surface $102t$ of the substrate 102. For example, the top surfaces of the portion of the second conductivity region 106, the fourth terminal region 114 and the fifth terminal region 116 may be coplanar and aligned with the top surface $102t$ of the substrate 102.

By adjusting the length of the lateral spacing $S_{46}$ between the fourth and fifth terminal regions 114, 116, the trigger voltage of the ESD protection device 100/200 may be adjusted. For instance, the trigger voltage of the ESD protection device 100 may be reduced by reducing the lateral spacing $S_{46}$ between the fourth and fifth terminal regions 114, 116.

Figure 3:
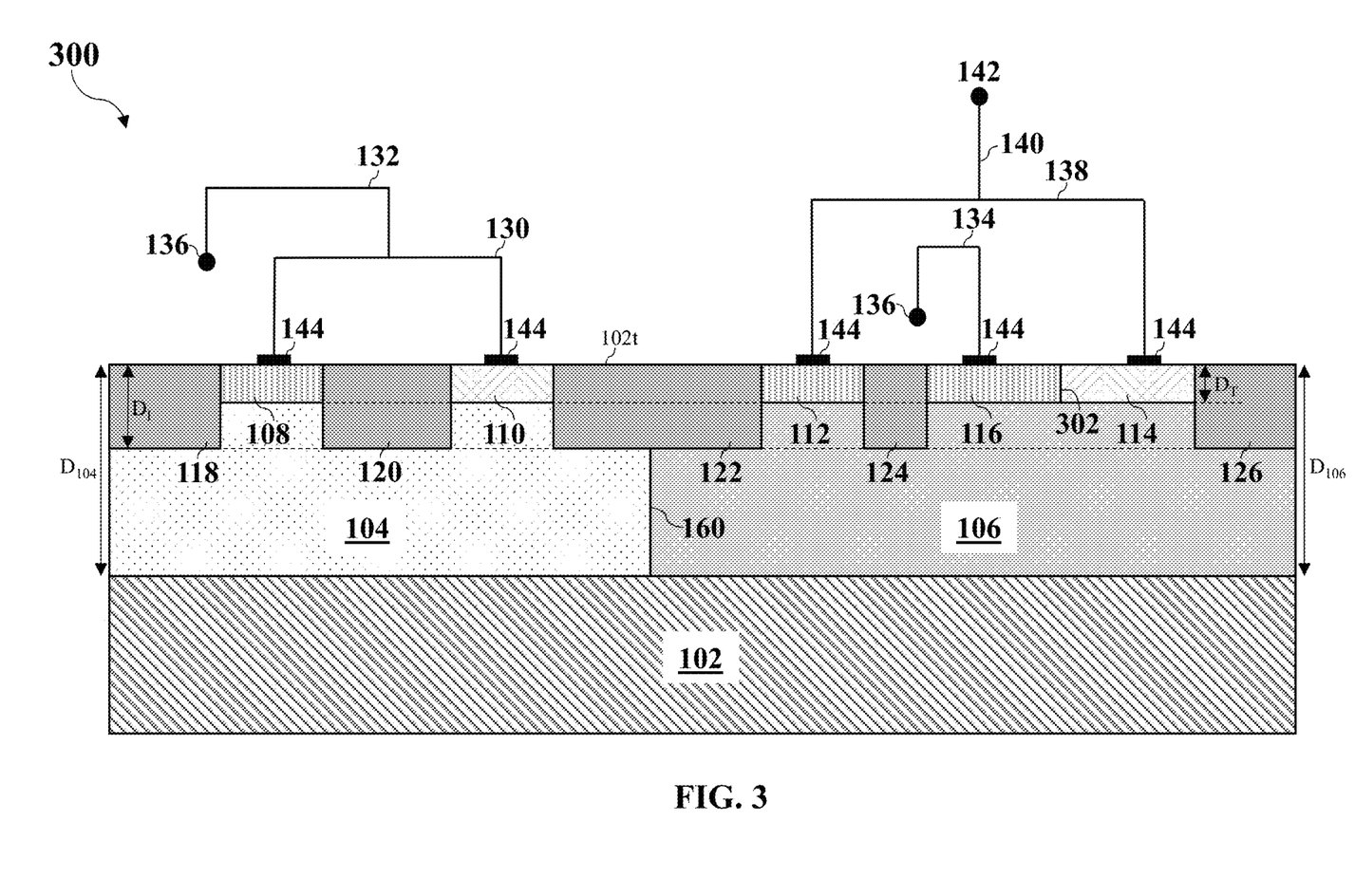
FIG. 3 shows a simplified cross-sectional view of an ESD protection device according to alternative non-limiting embodiments.

FIG. 3 shows a cross-sectional view of an ESD protection device 300 according to alternative non-limiting embodiments. The ESD protection device 300 is similar to the ESD protection device 200 and hence, the common features are labelled with the same reference numerals and need not be discussed.

As shown in FIG. 3, the fourth terminal region 114 and the fifth terminal region 116 of the ESD protection device 300 may be arranged alongside each other and may join each other. The junction 302 between the fourth and fifth terminal regions 114, 116 may be a P-N junction and due to the higher doping concentrations of the fourth and fifth terminal regions 114, 116, this P-N junction 302 may break down at a smaller voltage than the P-N junction 160 between the first and second conductivity regions 104, 106. Due to the joint between the fourth and fifth terminal regions 114, 116, this P-N junction 302 may also break down at a smaller voltage than the P-N junctions 150 in the ESD protection devices 100, 200. Hence, the trigger voltage of the ESD protection device 300 may be smaller than that of the ESD protection devices 100, 200. However, reducing the lateral spacing $S_{46}$ between the fourth and fifth terminal regions 114, 116 may increase a leakage current of the ESD protection device 300. The lateral spacing $S_{46}$ between the fourth and fifth terminal regions 114, 116 may range from about 0 um to about 0.5 um, and in some non-limiting embodiments, to obtain an optimal trade-off between achieving a smaller trigger voltage and reducing the leakage current, the spacing $S_{46}$ between the fourth and fifth terminal regions 114, 116 may range from about 0.2 μm to about 0.5 μm.

Figure 4:
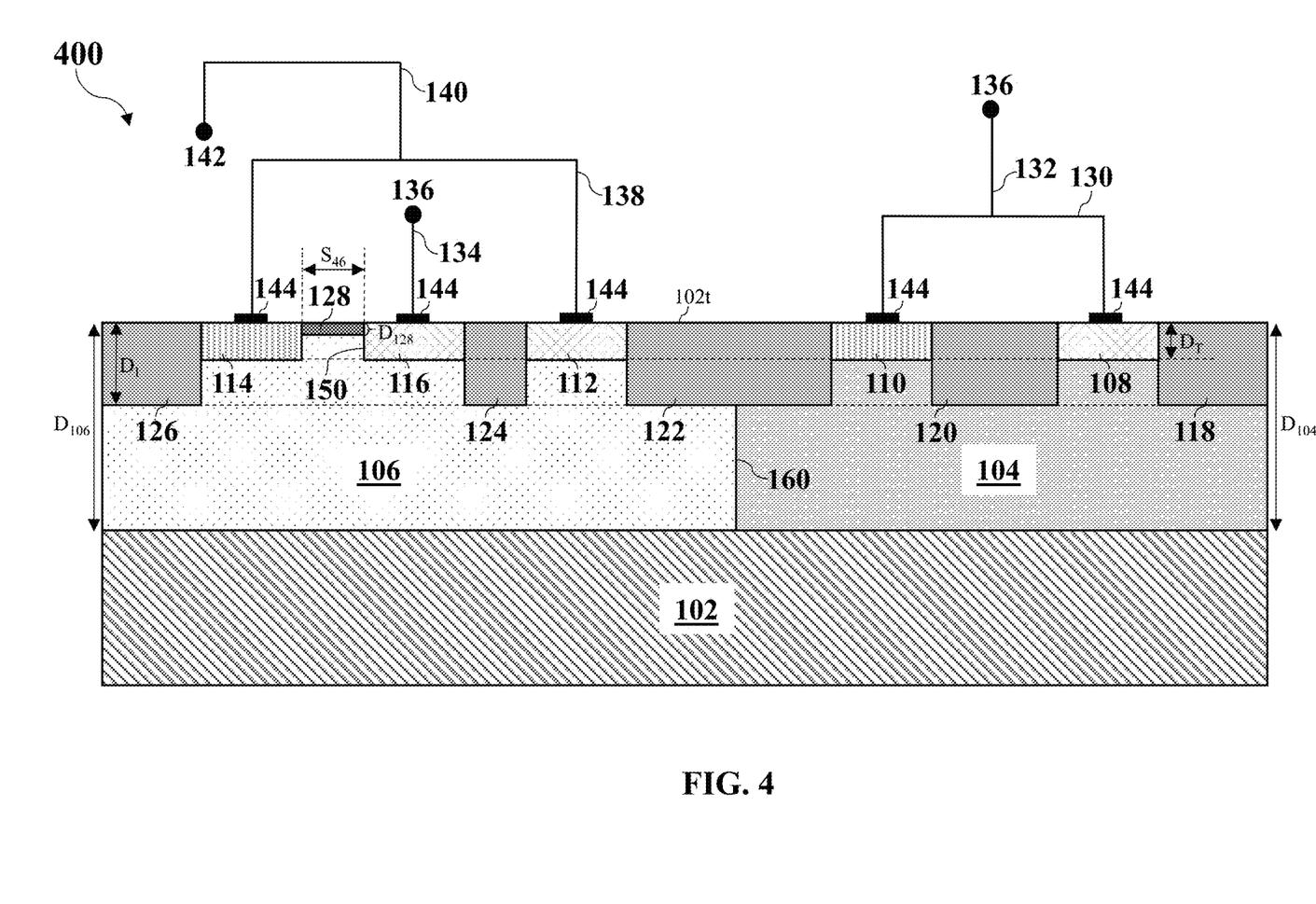
FIG. 4 shows a simplified cross-sectional view of an ESD protection device according to alternative non-limiting embodiments.

FIG. 4 shows a simplified cross-sectional view of an ESD protection device 400 according to alternative non-limiting embodiments. The ESD protection device 400 is similar to the ESD protection device 100 and hence, the common features are labelled with the same reference numerals and need not be discussed.

As shown in FIG. 4, the ESD protection device 400 may also include a substrate 102 including a first conductivity region 104 and a second conductivity region 106 arranged therein. Similar to the ESD protection device 100, the first conductivity region 104 may include first and second terminal regions 108, 110; whereas, the second conductivity region 106 may include third, fourth and fifth terminal regions 112, 114, 116, with the fifth terminal region 116 arranged laterally between the third and fourth terminal regions 112, 114. The first, second and fifth terminal regions 108, 110, 116 may be electrically coupled with each other and to a first conductive pad 136 by an electrically conductive unit (including for example, electrically conductive lines 130, 132, 134). Similarly, the third and fourth terminal regions 112, 114 may be electrically coupled with each other and to a second conductive pad 142 by another electrically conductive unit (including for example, electrically conductive lines 138, 140). An isolation element 128 may also be arranged laterally between the fourth and fifth terminal regions 114, 116.

However, compared to the ESD protection device 100, the substrate 102 may have a different conductivity type from the first conductivity region 104 in the ESD protection device 400. For example, in the ESD protection device 400, the first conductivity region 104, the first terminal region 108, the third terminal region 112 and the fifth terminal region 116 may have a first conductivity type; whereas, the substrate 102, the second conductivity region 106, the second terminal region 110 and the fourth terminal region 114 may have a second conductivity type different from the first conductivity type. In various non-limiting embodiments, the first conductivity type may be N-type and the second conductivity type may be P-type. For example, the substrate 102 may be a P-substrate, the first conductivity region 104 may be an N-well, the second conductivity region 106 may be a P-well, the first terminal region 108 may be an N-well (NW) node, the second terminal region 110 may be a P diffusion (PD) node, the third and fifth terminal regions 112, 116 may be N diffusion (ND) nodes and the fourth terminal region 114 may be a P-well (PW) node. However, the first conductivity type may alternatively be P-type and the second conductivity type may alternatively be N-type.

In an exemplary non-limiting embodiment, the first conductivity type may be N-type and the second conductivity type may be P-type. In this non-limiting embodiment, when the ESD protection device 400 is in operation, the first conductive pad 136 may be connected to an input/output terminal of the apparatus to be protected (where a voltage at this terminal may be a positive voltage), and the second conductive pad 142 may be connected to ground. The ESD protection device 400 may operate in a similar manner as the ESD protection device 100. For example, when the voltage at the input/output terminal of the apparatus exceeds a trigger voltage, the P-N junction 150 may break down and a first discharge current may flow from the first conductive pad 136 through the ESD protection device 400 (e.g. through the fifth terminal region 116, the second conductivity region 106, the fourth terminal region 114 and the second conductive pad 142 in this order) to ground. Thereafter, a second discharge current may flow from the first conductive pad 136 through the ESD protection device 400 (e.g. through the fifth terminal region 116, the second conductivity region 106, the third terminal region 112 and the second conductive pad 142 in this order) to ground. A duration of the second discharge current may be shorter than a duration of the first discharge current. Subsequently, the P-N junction 160 may break down and a third discharge current may flow from the first conductive pad 136 through the ESD protection device 400 (e.g. through the second terminal region 110, the first conductivity region 104, the second conductivity region 106, the third terminal region 112 and the second conductive pad 142 in this order) to ground. Excess current may thus be redirected from the apparatus and the apparatus may be protected from damage due to the ESD event. It would be clear to a person skilled in the art that the directions of the first and second discharge currents described above will change accordingly when the first conductivity type and the second conductivity type are instead the P-type and the N-type respectively.

Similar to the ESD protection device 100, the P-N junction 150 may break down at a smaller voltage than the P-N junction 160 in the ESD protection device 400. Accordingly, the trigger voltage of the ESD protection device 400 may also be smaller as compared to that of prior art devices. For example, the trigger voltage of prior art devices may range from around 10V to 14V; whereas, the trigger voltage of the ESD protection device 400 may range from about 6V to 10V (and may in one non-limiting embodiment, be about 8V).

Figure 5:
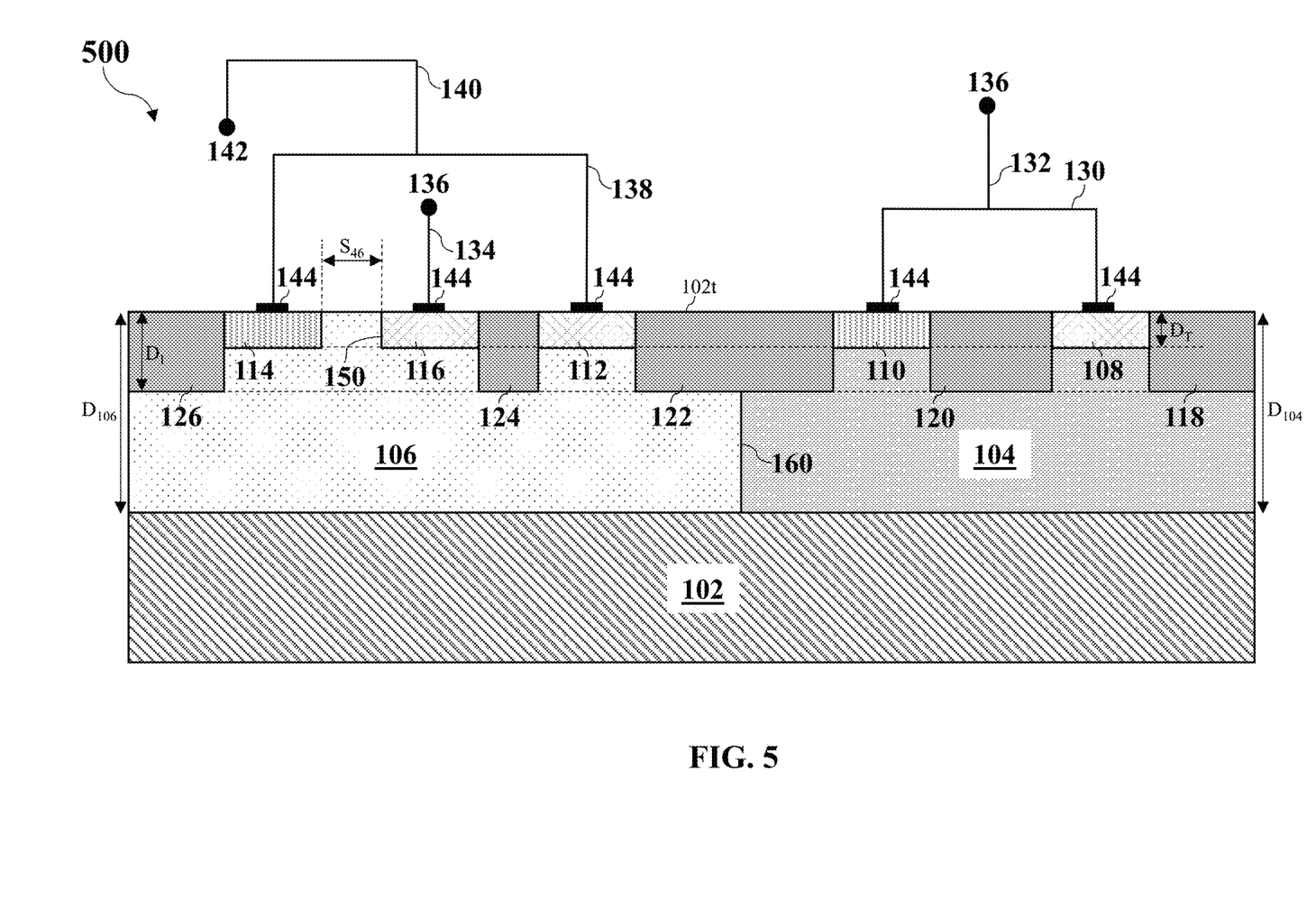
FIG. 5 shows a simplified cross-sectional view of an ESD protection device according to alternative non-limiting embodiments.

The isolation element 128 in the ESD protection device 400 may also be optional. FIG. 5 shows a cross-sectional view of an ESD protection device 500 according to alternative non-limiting embodiments. The ESD protection device 500 is similar to the ESD protection device 400 and hence, the common features are labelled with the same reference numerals and need not be discussed. As shown in FIG. 5, the isolation element 128 may be absent in the ESD protection device 500. Thus, a portion of the second conductivity region 106 may be arranged laterally between the fourth and fifth terminal regions 114, 116, where the portion of the second conductivity region 106, the fourth terminal region 114 and the fifth terminal region 116 may be arranged along the top surface 102*t* of the substrate 102. For example, the top surfaces of the portion of the second conductivity region 106, the fourth terminal region 114 and the fifth terminal region 116 may be coplanar and aligned with the top surface 102*t* of the substrate 102.

Figure 6:
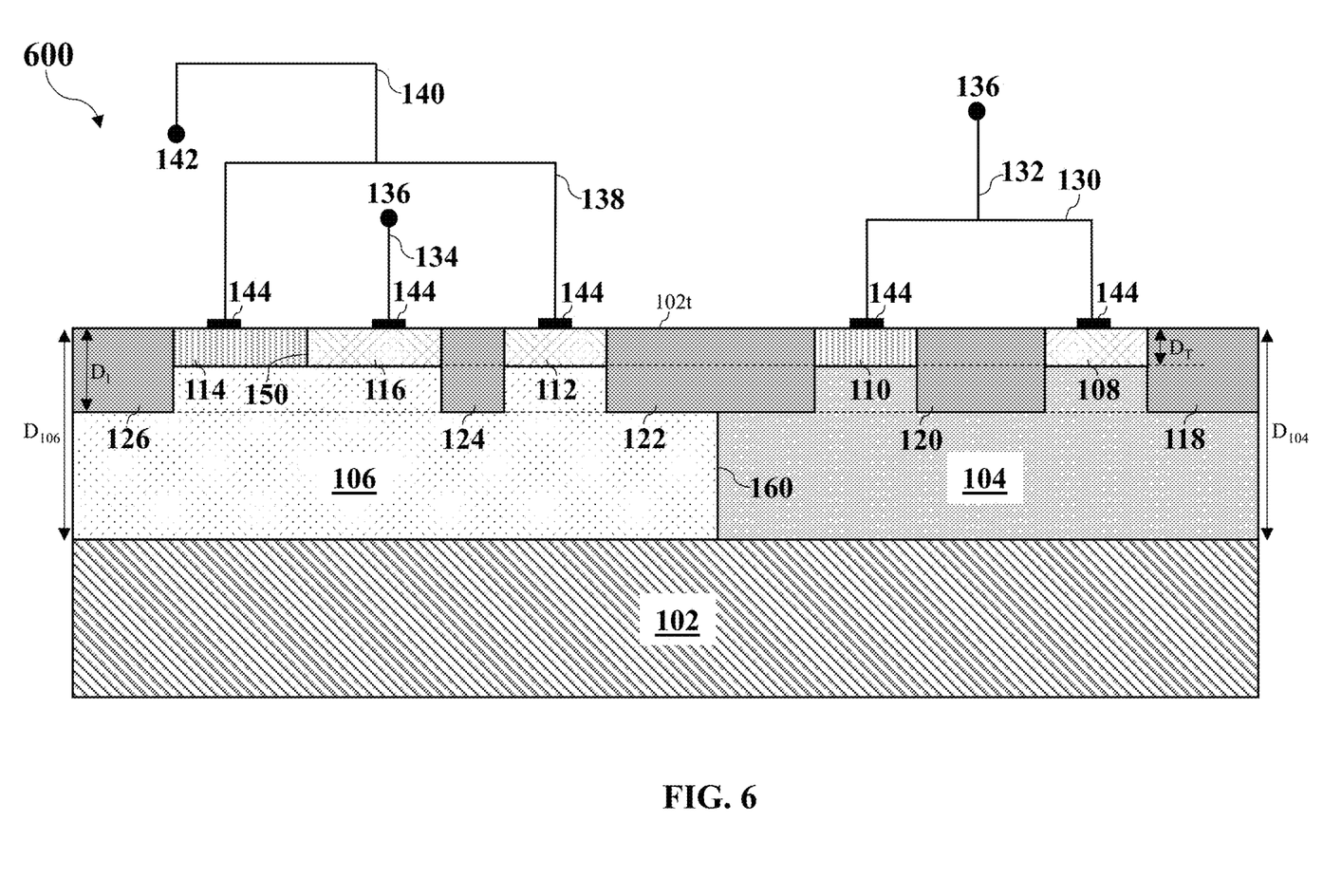
FIG. 6 shows a simplified cross-sectional view of an ESD protection device according to alternative non-limiting embodiments.

The spacing $S_{46}$ between the fourth terminal region 114 and the fifth terminal region 116 may also be adjusted to adjust the trigger voltage of the ESD protection device 400/500. FIG. 6 shows a cross-sectional view of an ESD protection device 600 according to alternative non-limiting embodiments. The ESD protection device 600 is similar to the ESD protection device 500 and hence, the common features are labelled with the same reference numerals and need not be discussed. As shown in FIG. 6, in the ESD protection device 600, the fourth terminal region 114 and the fifth terminal region 116 may be arranged alongside each other and may join each other. Similar to the ESD protection device 300 as described above, the trigger voltage of the ESD protection device 600 may be smaller than that of the ESD protection devices 400, 500 due to the substantially zero lateral spacing between the fourth and fifth terminal regions 114, 116.

Figure 7:
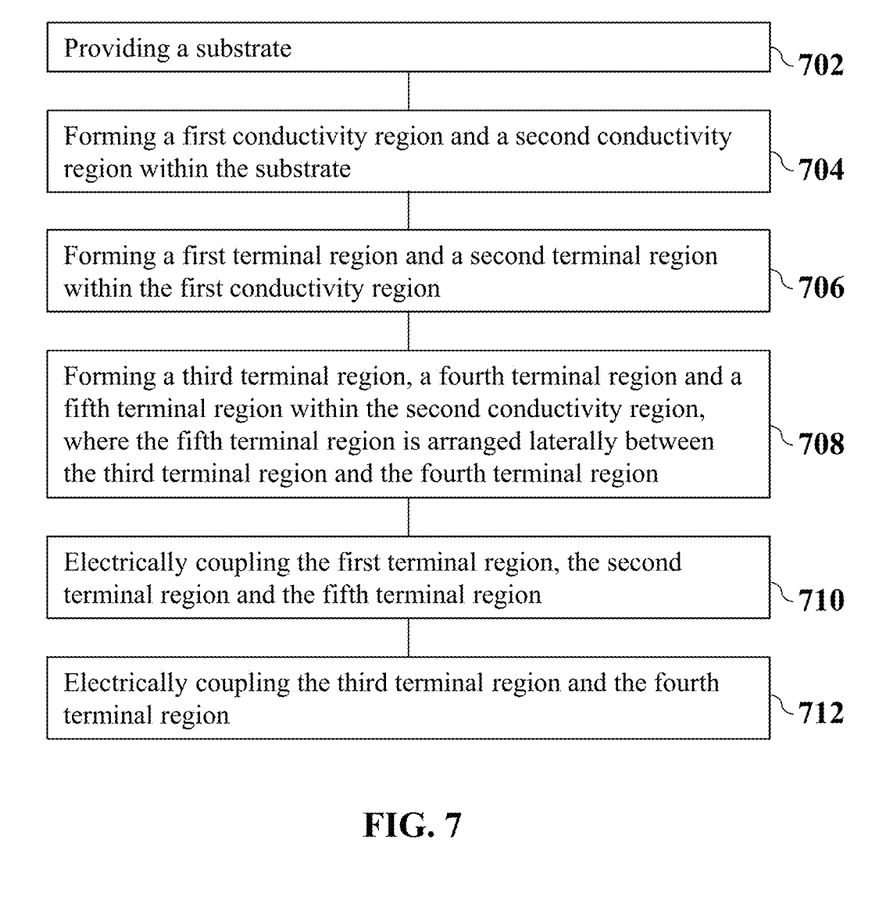
FIG. 7 shows a flow diagram of a method for fabricating an ESD protection device according to various non-limiting embodiments.

FIG. 7 shows a flow diagram of a method for fabricating an ESD protection device according to various non-limiting embodiments.

At 702, the method may include providing a substrate. The substrate may for example, be the substrate 102 described above.

At 704, the method may include forming a first conductivity region and a second conductivity region within the substrate. The first conductivity region and the second conductivity region may for example, be the first conductivity region 104 and the second conductivity region 106 as described above. 702 may include any process as known to those skilled in the art. For example, 702 may include doping particular portions of the substrate 102 with appropriate dopants to form the conductivity regions 104, 106.

At 706, the method may include forming a first terminal region and a second terminal region within the first conductivity region. The first terminal region and the second terminal region may for example, be the first terminal region 108 and the second terminal region 110 as described above. 706 may include any process as known to those skilled in the art. For example, 706 may include doping particular portions of the substrate 102 with appropriate dopants to form the terminal regions 108, 110.

At 708, the method may include forming a third terminal region, a fourth terminal region and a fifth terminal region within the second conductivity region, where the fifth terminal region may be arranged laterally between the third terminal region and the fourth terminal region. The third terminal region, the fourth terminal region and the fifth terminal region may for example, be the third terminal region 112, the fourth terminal region 114 and the fifth terminal region 116 as described above. 708 may include any process as known to those skilled in the art. For example, 708 may include doping particular portions of the substrate 102 with appropriate dopants to form the terminal regions 112, 114, 116.

At 710, the method may include electrically coupling the first terminal region, the second terminal region and the fifth terminal region. 710 may include any process as known to those skilled in the art. For example, 710 may include forming conductive lines (for example, conductive lines 130, 132, 134 as described above) to connect the first terminal region, the second terminal region and the fifth terminal region. These conductive lines may be formed by a back-end-of-line (BEOL) process.

At 712, the method may include electrically coupling the third terminal region and the fourth terminal region. 712 may include any process as known to those skilled in the art. For example, 712 may include forming conductive lines (for example, conductive lines 138, 140 as described above) to connect the third terminal region and the fourth terminal region. Similarly, these conductive lines 138, 140 may be formed by a BEOL process.

The above described order for the method is only intended to be illustrative, and the method is not limited to the above specifically described order unless otherwise specifically stated.

Further, the method may also include forming insulation elements (for example, insulation elements 118, 120, 122, 124, 126 as described above). This may include removing portions of the substrate 102 (by for example, etching the substrate 102) to form openings/trenches and filling these openings/trenches with an electrically insulating material. The method may also include forming the isolation element 128 by similarly removing a portion of the substrate 102 to form an opening/trench and filling this opening/trench with an electrically insulating material. The method may in addition include forming conductive pads (for example, conductive pads 136, 142, 144 as described above) using any method as known to those skilled in the art. In some non-limiting embodiments, the method may further include smoothing the top surface of the substrate (for example, substrate 102 as described above) using any process as known to those skilled in the art, such as, but not limited to, a chemical mechanical polishing (CMP) process. In these non-limiting embodiments, the top surfaces of the terminal regions, the insulation elements and the isolation element (for example, terminal regions 108-116, insulation elements 118-126 and isolation element 128 as described above) may be coplanar and aligned with the top surface 102t of the substrate 102.

The above described method may be used for fabricating any one of the ESD protection devices 100, 200, 300, 400, 500, 600. As compared to methods for fabricating prior art devices, the ESD protection devices 100, 200, 300, 400, 500, 600 may be fabricated without using any extra mask.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. An electrostatic discharge (ESD) protection device comprising:
a substrate comprising a first conductivity region and a second conductivity region arranged laterally adjacent to each other and are joined to each other;
wherein the first conductivity region comprises a first terminal region and a second terminal region electrically coupled with each other and a first conductive pad;
wherein the second conductivity region comprises a third terminal region and a fourth terminal region electrically coupled with each other and a second conductive pad;
wherein the second conductivity region further comprises:
a fifth terminal region arranged laterally between the third terminal region and the fourth terminal region, and electrically coupled with the first terminal region, the second terminal region and the first conductive pad; and
an insulation element arranged laterally between the third terminal region and the fifth terminal region,
wherein the first conductivity region, the first terminal region, the third terminal region, and the fifth terminal region have a first conductivity type; and wherein the second conductivity region, the second terminal region, and the fourth terminal region have a second conductivity type different from the first conductivity type,
wherein the first conductivity type is selected from N-type or P-type, and the second conductivity type is selected from N-type or P-type,
wherein either:
a portion of the second conductivity region is arranged laterally between the fourth terminal region and the fifth terminal region to form a P-N junction between the fifth terminal region and the second conductivity region; or
(ii) the fifth terminal region and the fourth terminal region are arranged alongside each other and join each other to form a P-N junction between the fifth terminal region and the fourth terminal region.

2. The ESD protection device of claim 1, wherein the substrate has the first conductivity type.

3. The ESD protection device of claim 1, wherein the substrate has the second conductivity type.

4. The ESD protection device of claim 1, further comprising an isolation element arranged laterally between the fourth terminal region and the fifth terminal region when the portion of the second conductivity region is arranged laterally between the fourth terminal region and the fifth terminal region to form the P-N junction between the fifth terminal region and the second conductivity region.

5. The ESD protection device of claim 4, wherein the isolation element joins the fourth terminal region and further joins the fifth terminal region.

6. The ESD protection device of claim 4, wherein the isolation element, the fourth terminal region and the fifth terminal region are arranged along a top surface of the substrate.

7. The ESD protection device of claim 4, wherein the isolation element comprises an electrically insulating material.

8. The ESD protection device of claim 4, wherein a portion of the second conductivity region is arranged under the isolation element and laterally between the fourth terminal region and the fifth terminal region.

9. The ESD protection device of claim 4, wherein the isolation element comprises a silicide block.

10. The ESD protection device of claim 4, wherein a depth of the isolation element is less than a depth of the insulation element.

11. The ESD protection device of claim 4, wherein the isolation element and the insulation element comprise a same electrically insulating material.

12. The ESD protection device of claim 11, wherein the insulation element and the isolation element comprise shallow trench isolation regions.

13. The ESD protection device of claim 1, wherein the portion of the second conductivity region is arranged laterally between the fourth terminal region and the fifth terminal region; and wherein the portion of the second conductivity region, the fourth terminal region and the fifth terminal region are arranged along a top surface of the substrate.

14. The ESD protection device of claim 1, wherein the fifth terminal region and the fourth terminal region are arranged alongside each other and join each other.

15. The ESD protection device of claim 1, wherein a depth of the fifth terminal region is substantially equal to a depth of the fourth terminal region.

16. The ESD protection device of claim 1, wherein the first conductivity type is P-type and the second conductivity type is N-type.

17. The ESD protection device of claim 1, wherein the first conductivity type is N-type and the second conductivity type is P-type.

18. The ESD protection device of claim 1, wherein the ESD protection device comprises a silicon-controlled rectifier device.

19. A method for fabricating an electrostatic discharge (ESD) protection device, the method comprising:
providing a substrate;
forming a first conductivity region and a second conductivity region arranged laterally adjacent to each other and joined to each other within the substrate;
forming a first terminal region and a second terminal region within the first conductivity region;
forming a third terminal region, a fourth terminal region, and a fifth terminal region within the second conductivity region; wherein the fifth terminal region is arranged laterally between the third terminal region and the fourth terminal region; wherein an insulation element is arranged laterally between the third terminal region and the fifth terminal region,
electrically coupling the first terminal region, the second terminal region, the fifth terminal region and a first conductive pad; and
electrically coupling the third terminal region, the fourth terminal region and a second conductive pad;
wherein the first conductivity region, the first terminal region, the third terminal region, and the fifth terminal region have a first conductivity type; wherein the second conductivity region, the second terminal region, and the fourth terminal region have a second conductivity type different from the first conductivity type, wherein the first conductivity type is selected from N-type or P-type, and the second conductivity type is selected from N-type or P-type; and wherein either:

(i) a portion of the second conductivity region is arranged laterally between the fourth terminal region and the fifth terminal region to form a P-N junction between the fifth terminal region and the second conductivity region; or (ii) the fifth terminal region and the fourth terminal region are arranged alongside each other and join each other to form a P-N junction between the fifth terminal region and the fourth terminal region.

20. The ESD protection device of claim 1, wherein a doping concentration of the fourth and fifth terminal regions is higher than a doping concentration of the second conductivity region.

* * * * *